United States Patent [19]
Chung et al.

[11] Patent Number: 5,294,800
[45] Date of Patent: Mar. 15, 1994

[54] E-BEAM CONTROL DATA COMPACTION SYSTEM AND METHOD

[75] Inventors: Virginia M. Chung, Pleasant Valley; Gregory J. Dick, Beacon, both of N.Y.; Abigail S. Ganong, Sherman, Conn.; Edward J. Stashluk, Jr., Poughkeepsie, N.Y.

[73] Assignee: International Business Machines Corporation, Armonk, N.Y.

[21] Appl. No.: 922,923

[22] Filed: Jul. 31, 1992

[51] Int. Cl.⁵ .......................................... H01J 37/302
[52] U.S. Cl. ................................................ 250/492.22
[58] Field of Search ............ 250/492.2, 492.22, 492.3, 250/398

[56] References Cited

U.S. PATENT DOCUMENTS

| | | | |
|---|---|---|---|
| 4,147,937 | 4/1979 | Buelow et al. | 250/492 A |
| 4,259,724 | 3/1981 | Suglyama | 364/491 |
| 4,482,810 | 11/1984 | Cooke | 250/492.2 |
| 4,484,077 | 11/1984 | Igaki et al. | 250/492.2 |
| 4,520,269 | 5/1985 | Jones | 250/492.2 |
| 4,554,625 | 11/1985 | Otten | 364/148 |
| 4,587,608 | 5/1986 | Kishi et al. | 364/191 |
| 4,812,962 | 3/1989 | Witt | 364/490 |
| 4,816,692 | 3/1989 | Rudert, Jr. | 250/492.22 |
| 4,820,928 | 4/1989 | Ooyama et al. | 250/492.2 |
| 4,878,177 | 10/1989 | Ikenaga et al. | 364/489 |
| 4,895,780 | 1/1990 | Nissan-Cohen et al. | 430/5 |
| 4,914,304 | 3/1990 | Koyama | 250/492.2 |
| 4,943,729 | 7/1990 | Ando et al. | 250/492.3 |
| 5,086,398 | 2/1992 | Moriizumi | 250/492.22 |
| 5,159,201 | 10/1992 | Frei | 250/492.22 |
| 5,189,306 | 2/1993 | Frei | 250/492.22 |

FOREIGN PATENT DOCUMENTS 0391636 2/1990 European Pat. Off. ............. 21/308

OTHER PUBLICATIONS

A. Appel et al., "Rectangle Overlap Test and Partitioning Technique", IBM Technical Disclosure Bulletin, vol. 18, No. 10, pp. 3453-3455, Mar. 1976.

A. Appel et al., "Technique to Fill a Complex Polygon with Rectangles", IBM Technical Disclosure Bulletin, vol. 20, No. 7, pp. 2921-2924, Dec. 1977.

T. Chang et al., "Partitioning E-Beam Data for Proximity Corrections", IBM Technical Disclosure Bulletin, vol. 20, No. 9, pp. 3809-3812, Feb. 1978.

(List continued on next page.)

*Primary Examiner*—Bruce C. Anderson
*Attorney, Agent, or Firm*—Charles W. Peterson, Jr.

[57] ABSTRACT

A system and method for exposing a radiation sensitive layer to one or more repetitious design cells. Each design cell includes at least one design shape on at least one buildlevel. Each shape represents a circuit shape, or part of a circuit shape on an integrated circuit layer in a circuit on an integrated circuit chip. For each buildlevel: the design is parceled into units that contain approximately the same optimum number of vertices; and for each parcel: Each design cell occurrence, or transform, is examined to determine whether it has proximity effect commonality with other cell transforms (a common environment) and, based on that determination, the cell transform is placed into one of three groups, Macro Candidates, Nested Candidates, and Unnested Candidates. In each Macro Candidate and Nested Candidate any overlapping shapes are combined, or unioned, to form a single shape and, then, the shapes are reconstructed (filled) with rectangles (fill rectangles). Each Macro Candidate design cell is proximity corrected for forward and backward scattering, and the result is placed in a Macro Buffer. Each Nested Candidate design cell is proximity corrected for forward scattering. Nested Candidates are unnested and merged with the Unnested Candidates. The unnested shapes are proximity corrected, former Nested Candidates are proximity corrected for backward scattering and former Unnested Candidates are proximity Corrected for forward and backward scattering. The proximity corrected unnested shapes are stored in a pattern buffer. Finally, the proximity corrected shapes are passed from the pattern buffer and the macro buffer to an electron beam (E-beam) tool as Numerical Control (NC) data.

39 Claims, 12 Drawing Sheets

OTHER PUBLICATIONS

M. Parikh, "Technique for Automatic Subdivision of Pattern Data for Enhanced Proximity Effect Corrections", IBM Technical Disclosure Bulletin, vol. 21, No. 10, pp. 4278–4279, Mar. 1979.

M. Parikh, "Self-Consistent Correction of Proximity Effects in Electron-Beam Lithography", IBM Technical Disclosure Bulletin, vol. 22, No. 9, pp. 4327–4328, Feb. 1980.

P. Cardenia et al., "Method and Apparatus for Digital Control of E-Beam Pattern Writing as Applied to Subfield and Vector Equipment", IBM Technical Disclosure Bulletin, vol. 22, No. 10, pp. 4583–4585, Mar. 1980.

M. Parikh, "Data Zoning in the Proximity-Effect Correction Technique", IBM Technical Disclosure Bulletin, vol. 22, No. 11, pp. 5187–5189, Apr. 1980.

P. Cardenia, "Data Compression for E-Beam Tool", IBM Technical Disclosure Bulletin, vol. 23, No. 2, pp. 588–590, Jul. 1980.

E. Bretscher, "Proximity Correction in Electron Beam Lithography", IBM Technical Disclosure Bulletin, vol. 23, No. 6, p. 2541, Nov. 1980.

A. Muir, "Method and Apparatus to Provide Rapid Interpretation of Digital Source Information During Electron-Beam Pattern Writing of Rectangular Shapes", IBM Technical Disclosure Bulletin, vol. 24, No. 11A, pp. 5681–5687, Apr. 1982.

T. Landon et al., "Variable-Length Command Processing for an E-Beam Tool", IBM Technical Disclosure Bulletin, vol. 27, No. 4A, pp. 2130–2131, Sep. 1984.

K. Koyama et al., "Integrated Data Conversion for the Electron Beam Exposure System EX-7", Journal of Vacuum Science and Technology, vol. 6, No. 6, pp. 2061–2065, Nov./Dec. 1988.

A. Broers, "Resolution Limits for Electron-Beam Lithography", IBM Journal of Research Development, vol. 32, No. 4, pp. 504–512, Jul. 1988.

T. Abe, "Proximity Effect Correction for an Electron Beam Direct Writing System EX-7", Journal of Vacuum Science and Technology, vol. 7, No. 6, pp. 1524–1527, Nov./Dec. 1989.

P. Vermeulen, "Proximity-Effect Correction in Electron-Beam Lithography", Journal of Vacuum Science and Technology, vol. 7, No. 6, pp. 1556–1560, Nov./Dec. 1989.

C. Ashton et al., "Fast, Accurate Proximity Correction Algorithm for 0.25 $\mu$m Electron-Beam Lithography", IBM Technical Disclosure Bulletin, vol. 33, No. 10B, pp. 282–283, Mar. 1991.

J. Rudert, "Scheme for Proximity Correcting Repitive Design Features", IBM Technical Disclosure Bulletin, vol. 30, No. 5, pp. 436–437, Oct. 1987.

E-BEAM CONTROL DATA COMPACTION SYSTEM AND METHOD

FIELD OF THE INVENTION

The present invention relates generally to the fabrication of integrated circuits and more particularly, to a method of lithographic patterning integrated circuit patterns on a radiation sensitive layer by an electron beam exposure system.

BACKGROUND OF THE INVENTION

Integrated circuit shapes can be patterned on a semiconductor wafer entirely by means of direct writing, electron beam (E-beam) lithography. Methods of using an E-beam to write microcircuit patterns in integrated circuit fabrication are well known in the art.

The intended pattern can be written directly onto a semiconductor wafer by first exposing a thin layer of radiation sensitive material on the wafer with a beam of electrons. Alternatively, a thin layer of photoresist on the semiconductor wafer may be exposed optically, using a mask made with an E-beam tool. Whether the pattern is directly written with an E-beam or indirectly written with a mask made with an E-beam, the E-beam tool control remains the same. See generally, U.S. Pat. No. 4,259,724 for an example of an E-beam lithography system for direct writing to expose an entire wafer. The use of a computer to generate control data and to control the E-beam is also well known. See U.S. Pat. No. 4,820,928 for an example of a computer controlled microcircuit fabrication system. E-beam lithography provides the advantage of very sharply defined patterns for very small geometric shapes. However, transferring those computer designed to a physical image on a photoresistive, or radiation sensitive layer (resist), can be both expensive and time consuming. Most of the expense associated with transforming the shape is computer operating cost, which is also generally time dependent.

Therefore, reducing computer operating time will reduce the expense associated with E-beam lithography. Several approaches have been used to reduce the time required to expose a wafer with an E-beam tool. See U.S. Pat. No. 4,147,937 for an example of a method and an apparatus for exposing a wafer by raster scan writing, i.e., a single line at a time. See also, U.S. Pat. No. 4,914,304 for an example of an E-beam exposure system that uses a shaped beam to improve exposure of different shapes. Although these prior art approaches may have reduced wafer exposure time, they did not appreciably reduce the shape conversion time, i.e., the computer time required to prepare the shapes in a design for use on the E-beam tool. Converting the design data to Numerical Control (NC) data is called postprocessing the design. NC data is used to control an E-beam tool in exposing a radiation sensitive layer. Prior art methods of postprocessing design shapes may need several hundreds of Central Processing Unit (CPU) minutes to convert one design layer into NC data. So, postprocessing a design, converting the graphics representation of design shapes to control for the E-beam tool, is a major computer bottleneck.

The flow diagram of FIG. 1 shows the steps typically taken in the prior art to convert design data into E-beam tool control data and to expose a semiconductor wafer. Each design shape is represented in a graphics language by lines, rectangles, circles, and polygons. Such a representation is characteristic of the particular shape and graphics language. It is the graphics representation of the shape that is postprocessed, converting the graphics representation to Numerical Control (NC) data for an E-beam tool. The E-beam tool uses the converted, or postprocessed, information to direct the electron beam onto the radiation sensitive layer, which writes, or exposes, the design shape into the layer. The computer running the postprocessing program (called the postprocessor) combines the graphics design 30 and key E-beam tool processing parameters 32 (called keywords) to produce NC data.

Before postprocessing the design data, the graphics language representation of the design data 30 and the keywords 32 are checked 34 for syntax errors. After verifying that there are no syntax errors, the post processor decomposes 36 each design shape into a series of edges and then labels 38 each edge. An edge is part of the shape's perimeter and is normally a straight line connecting two vertices on the shape. Each converted edge is labeled 38 according to its position on a shape as a top, bottom, right or left edge. The postprocessor then applies 40 keywords that describe shape compensation, known as etch biases, to the edges. An etch bias is a compensation for the distortion to a design shape that occurs while writing and forming the final shape. Next, the postprocessor transforms 42 the edges from the graphics language grid (a unit of measure) to the E-beam tool grid. The postprocessor combines any butting or overlapping transformed edges (called unioning 44 the shapes or edges). When two edges are unioned, the unioned edges form a single, common edge.

After unioning the edges, the postprocessor fills 46 the shapes. Reconstructing a shape out of one or more types of basic polygons, e.g., rectangles, such that the reconstructed shape is, as nearly as possible, identical to the design shape is called "filling the shape." The reconstructed design shape is said to be filled with fill polygons or fill rectangles. See U.S. Pat. No. 4,554,625 for an example of a method of producing nonoverlapping rectangles to fill a shape.

The fill rectangles generated during the fill 46 provide the E-beam tool with control data to direct the E-beam to expose a rectangular area. For examples of rectangle generators, see, "Method and Apparatus for Digital Control of E-Beam Pattern Writing as Applied to Subfield and Vector Equipment," in the March 1980 IBM Technical Disclosure Bulletin page 4583, and see, "Method and Apparatus to Provide Rapid Interpretation of Digital Source Information During Electron-Beam Pattern Writing of Rectangular Shapes," in the April 1982 IBM Technical Disclosure Bulletin page 5681.

After the fill 46, the filled shapes, i.e. the fill rectangles, are proximity corrected 48 for proximity effects. Proximity effects are created by electrons being scattered while traveling to, from and in the resist. These scattered and reflected electrons partially expose the resist up to several micrometers from their intended point of impact (called the scattering radius) causing over exposure of surrounding shapes. Proximity correction 48 means adding control information to the fill rectangles to adjust the length of time that the E-beam exposes the resist. For example, a fill rectangle, when exposed, may cause interference with adjacent fill rectangles known as blooming. Blooming causes "fuzzy" edges and unintentionally filled notches because rectangles become overexposed. Blooming can be reduced by reducing beam exposure time for adjacent rectangles. Since proximity correction may require calculating a value for each fill rectangle with respect to each fill rectangle within its scattering radius, there may be several calculations required for each fill rectangle. Consequently, calculating proximity correction values may require as much or more CPU time as filling the design shapes.

After proximity correction, the fill data is gray-spliced 50. Gray-splicing is done because the E-beam deflection field is much smaller than an integrated circuit chip. So, the integrated circuit chip is divided into subfields, which are slightly smaller than the E-beam's deflection field. When the shapes in a subfield are written, any shapes lying on or spanning subfield boundaries may be partially written. To maintain a spanning shape's edge definition, the exposure from each subfield is overlapped into its adjacent subfield and the exposure time in the overlap is reduced. Thus, because a spanning shape is partially exposed in the overlap from each subfield, it is said to be grayed. Since the result of overlapping the grayed portions of a spanning shape splices the shape's pieces together, the shape is said to be gray-spliced.

Once gray-splicing (also spelled grey-splicing) is complete, the fill data is encoded and passed 52 to the E-beam tool as NC data. NC data is a series of commands used to control an E-beam tool, directing the tool to expose the radiation sensitive layer in a predetermined set of steps, at a predetermined exposure level. In one prior art method, fill rectangles are further reduced into one or more sub-areas called spots, each of which will be written by a vertical or horizontal raster scan. When the fill data is encoded as NC data, each fill rectangle is stored as NC data in a storage area called the pattern buffer. The exposure level is the proximity corrected value from 48 and is part of this NC data.

After the design data is converted to NC data, the E-beam tool writes 54 the design onto a wafer by exposing each fill rectangle onto a radiation sensitive layer. Once every fill rectangle has been exposed, the design shape will have been written onto the layer. The exposed pattern can be developed similarly to photodeveloping. After developing the resist, the wafer is etched, implanted or otherwise similarly altered to imprint the pattern onto the wafer. So, the NC data for E-beam tool is encoded from the data generated in the fill 46, proximity correction 48 and gray-splice 50. Since, during the fill, the computer must treat every shape as a puzzle in which the computer must both create the pieces and then fit them together; the fill 46 often accounts for a large portion of CPU time and may produce a large volume of data. Because the pieces created in the fill must be examined and, when necessary, corrected for proximity effects, proximity correction 48 may account for more CPU time and produce more data than the fill 46. Gray-splicing, which is done after proximity correction, may result in still a larger data volume and may account for the largest usage of CPU time.

A semiconductor chip, typically, has several layers of shapes, commonly known as levels that are overlaid to form micro circuits. These layers are commonly called mask levels because of the way the layers' patterns were transferred onto the chip, i.e. optically, by exposing photoresist with light directed through a mask. Although some mask levels may still be made with an optical tool, a single design may also require several levels that must be independently converted to E-beam control data. Additionally masks for optically exposed levels may be created using the same E-beam tool. Mask levels are also classified as positive or negative (also called reverse image) levels. The design shape is the intended image on a positive mask. Thus, a rectangle in the design would be an opaque rectangle on a positive mask. Conversely, a negative mask has a negative image of the design. So, a rectangle on the design would be a transparent rectangle in an opaque field on a negative mask.

The steps of filling, proximity correcting and gray-splicing each mask level are major CPU bottlenecks that may take several CPU hours each. The CPU through-put times tend to increase with $N^2$, where N is the number of shape edges. Since each circuit has several design shapes, and since the number of edges is directly related to the number of design shapes, CPU through-put is related to the number of circuits in the design. For a complex design, the time required to fill, to proximity correct or to gray-splice a single mask level exceeds the average time between CPU failures, known as the CPU's mean time to fail. Thus, the number of circuits allowed on an integrated circuit chip could be limited by factors such as the CPU's mean time to fail rather than the E-beam tool's other physical limitations. Reducing the time required in these bottlenecks would provide a significant improvement over slow prior art post processing methods. A prior art approach to reducing the data volume has been to add a data compaction subsystem called the E-beam system's macro buffer. The macro buffer is part of the E-beam tool's storage, dedicated to storing NC data for repetitive patterns known as "User Defined Macros" (UDMs). An occurrence of a cell in a design is called the cell's transform because the cell is transformed from the cell's coordinate system to the design's coordinate system. Thus, an occurrence of a UDM in a design is called the UDM's transform. When a macro buffer is employed, the macro transforms are replaced with macro read commands that are merged with the NC data for the remaining design (non-macro) shapes in the pattern buffer. When the E-beam tool encounters the macro read command in the pattern buffer, the tool retrieves the UDM from the macro buffer and executes the NC data on the UDM.

The macro buffer takes advantage of a repetitive characteristic inherent in most designs. That repetitive characteristic results from a basic precept of logic design that any logic function can be carried out entirely in NOR gates (or NAND gates). Designers follow this basic precept by limiting the number of unique circuits they create in designing a complex integrated circuit chip. Even on a very complex chip, the number of unique circuits may be less than 100. Usually each circuit is created once ("laid out") as a cell. Shapes on each layer within that cell may be repeated as a UDM for each macro transform. By maintaining the design's nesting (reusing macros), each cell is postprocessed once and the UDM placed in the macro buffer. Whenever the E-beam tool is to write the cell, the UDM is retrieved from the Macro buffer. For a chip such as a 1 Mbit Random Access Memory (RAM), storing one million occurrences each of a RAM cell with, say, 15 fill rectangles requires a large pattern buffer. For the same 1 Mbit RAM, a macro read command to call the RAM memory cell UDM would need a much smaller pattern buffer. Thus, the macro buffer provided a significant data compaction advantage.

However, very often in the prior art, proximity effects disrupted the uniformity of a repeated UDM because the proximity effects on fill rectangles in a macro depend not only on shapes within the macro, but also on the macro's placement with respect to adjacent rectangles and Macros. So, some UDMs have proximity effects that depend on placement and, therefore, require placement dependant proximity correction.

Gray-splicing also is placement dependent for each UDM. Some UDM transforms may not require gray-splicing, while other transforms have unique placement or gray-splicing requirements. In prior art postprocessors, these placement dependent UDMs were not left in the Macro buffer. Instead, they were unnested before fill and, the unnested, former UDM shapes were filled, proximity corrected, gray-spliced individually and placed in the pattern buffer, causing the pattern buffer to swell.

One method of data compaction that addressed varying proximity correction for a UDM is disclosed in "Scheme for Proximity Correcting Repetitive Design Features," in the October 1987 IBM Technical Disclosure Bulletin pages 436-7. The disclosed scheme or method was to strip out of the UDMs all rectangles requiring proximity correction. The stripped UDMs were then placed in the Macro buffer, and the stripped rectangles were proximity corrected and placed in the pattern buffer. This was an improvement over unnesting every UDM transform and placing the unnested data in the pattern buffer, but, it still resulted in high data volume and correspondingly awkward data handling problems.

Compounding these obstacles to maintaining data compaction are the additional problems that occur on a negative mask. Making a negative mask requires filling the area around the design shapes instead of filling the design shapes. While the design shapes themselves may be identical for two transforms of a cell, the fill for the area around the shapes may not be. If, for example a repetitive array cell has transforms along the array edge with shapes that intrude into the cell area, but do not touch any of the cell's rectangles, then the fill for the transforms of the cell along that edge will not be identical to the fill for other array cell transforms.

Additionally, proximity effects may not be identical even between array edge cell transforms. Usually, these edge cells are unnested and converted to NC data as non macros. The more the unnesting of Memory array cells that is required, the more the efficiency of the macro buffer is reduced, as is the advantage provided by the macro buffer.

PURPOSES OF THE INVENTION

It is a purpose of the present invention to improve particle beam tool fabrication of semiconductor chips.

It is another purpose of the present invention to reduce the computer processing time required in particle beam tool fabrication of semiconductor chip.

It is still another purpose of the present invention to reduce the data volume that is generated and must be maintained while fabricating integrated circuit chips.

It is still another purpose of the present invention to increase the number of circuits that may be placed on a semiconductor chip fabricated by particle beam lithography.

It is still another purpose of the present invention to improve conversion of circuit design shapes into particle beam lithography tool control data.

It is still another purpose of the present invention to improve compaction of control data for particle beam lithography tools.

SUMMARY OF THE INVENTION

The present invention is a system and method of exposing a radiation sensitive layer to a plurality of two dimensional shapes. An integrated circuit chip design of two dimensional shapes is divided into parcels (called parceling) that each contain about the same number of shape vertices. The number of vertices is a predetermined optimum number. Alterations to design data are done in each parcel individually. After parceling, each design shape is assigned to one of three groups: Macro Candidates; Nested Candidates; and Unnested Candidates. Macro Candidates are unioned, filled, proximity corrected and, finally, gray-spliced. Next Nested Candidates are unioned, filled and proximity corrected for forward scattering. Unnested Candidates are unioned and filled. Nested Candidates are then unnested. Proximity Correction is completed for all unnested shapes, i.e., the unnested Nested Candidate shapes are proximity corrected for backward scattering and, the Unnested Candidate shapes are proximity corrected for both forward and backward scattering. Finally, gray-splicing is done on the unnested shapes in the parcel. This process is repeated on each parcel until the last parcel is processed.

BRIEF DESCRIPTION OF THE DRAWINGS

While the specification concludes with claims particularly pointing out and distinctly claiming that which is regarded as the present invention, details of the preferred embodiments of the invention may be more readily determined from the following technical description when read with the following drawings, wherein:

DETAILED DESCRIPTION OF THE PREFERRED EMBODIMENT

Figure 1:
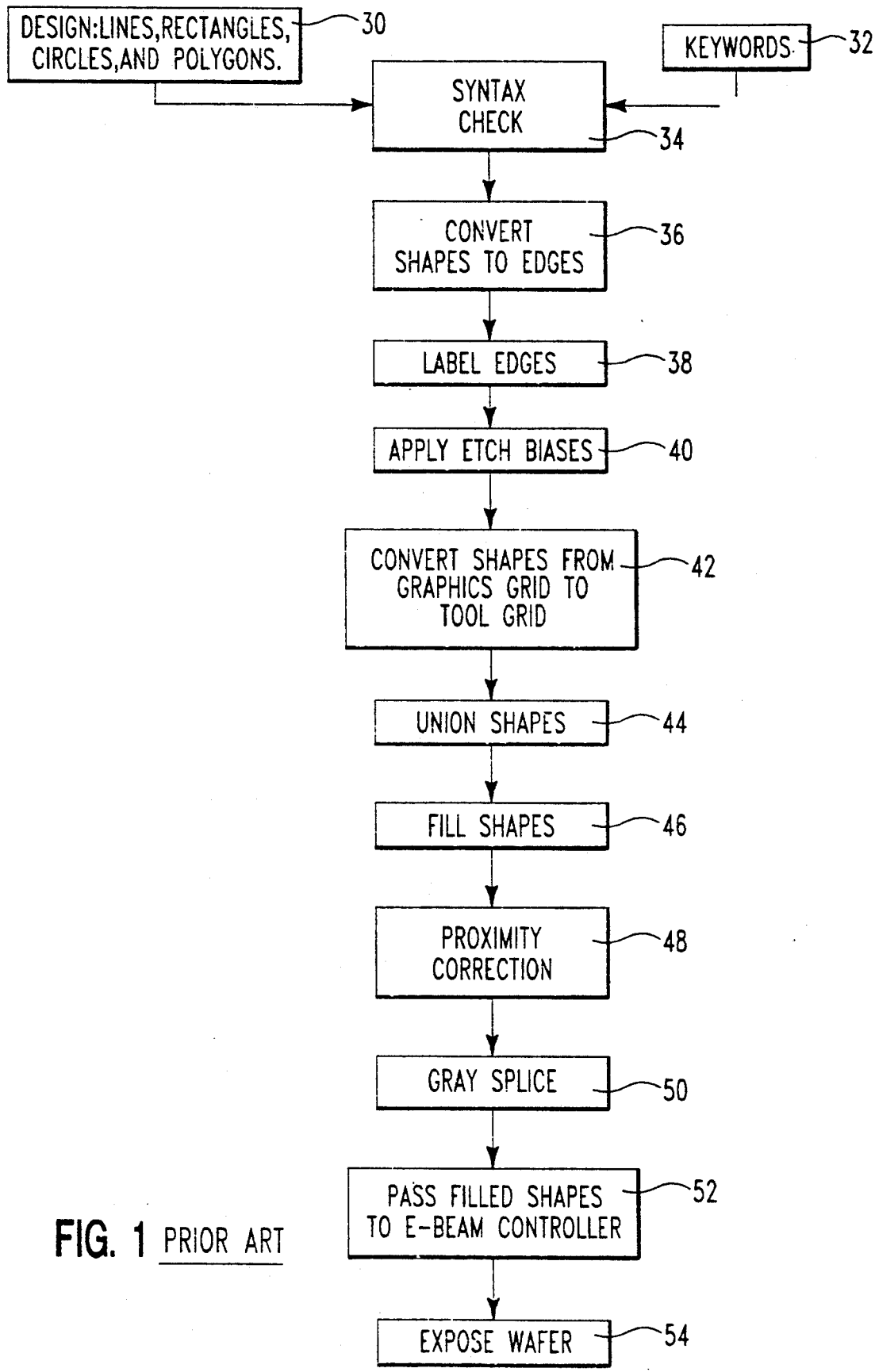
FIG. 1 is a prior art flow diagram for converting design data into E-beam tool control data.
Figure 2A:
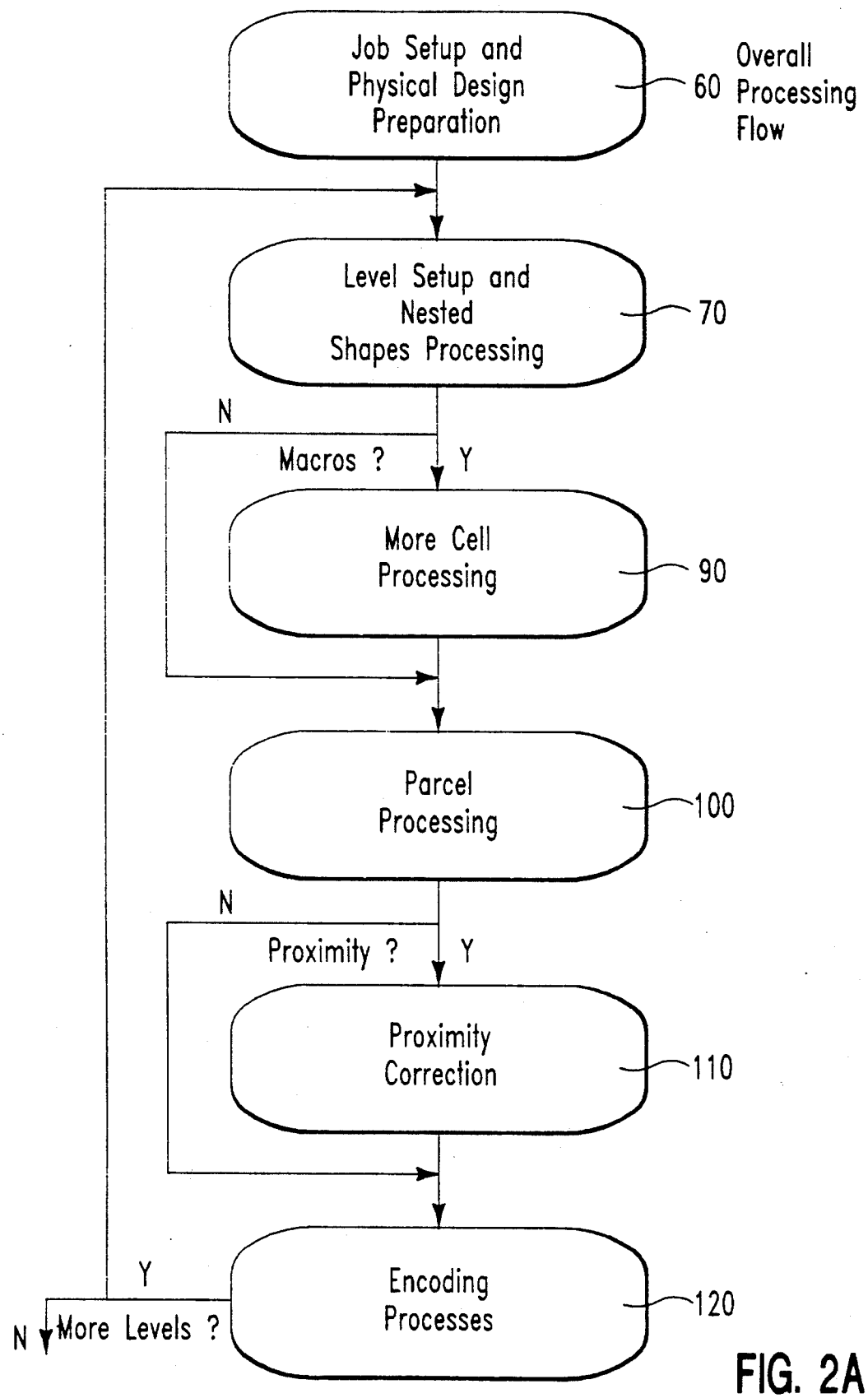
FIG. 2A-2G are flow diagrams for converting design data to Numerical Control Data according to the Present Invention.

FIG. 2A is a flow diagram of the preferred embodiment of the present invention. Table 1 is a pseudo code description of the method of the preferred embodiment of FIG. 2A. Flow diagrams for each step of FIG. 2A are provided in FIGS. 2B-2G.

TABLE 1

| Executive |
| --- |
| • Setup Disk I/0 links |
| • Allocate large memory area - for workspace and virtual datasets |
| • Call the "Job Setup & Physical Design Preparation" subexecutive 60 |
| • Do for each buildlevel in the physical design |
|     • Call the "Buildlevel Setup" subexecutive 70 which in turn calls the "Nested Shapes |

TABLE 1-continued

| Executive |
| --- |
| Processing" subexecutive 80<br>• If macros exist, call the "Macro Cell Processing" subexecutive 90<br>• Call the "Parcel Processing" subexecutive 100<br>• If proximity correction is requested, call the "Proximity Correction" subexecutive 110<br>• Call the "Encoding Processes" subexecutive 120<br>• Enddo<br>• Issue job messages, cleanup disk space, end job |

Figure 2B:
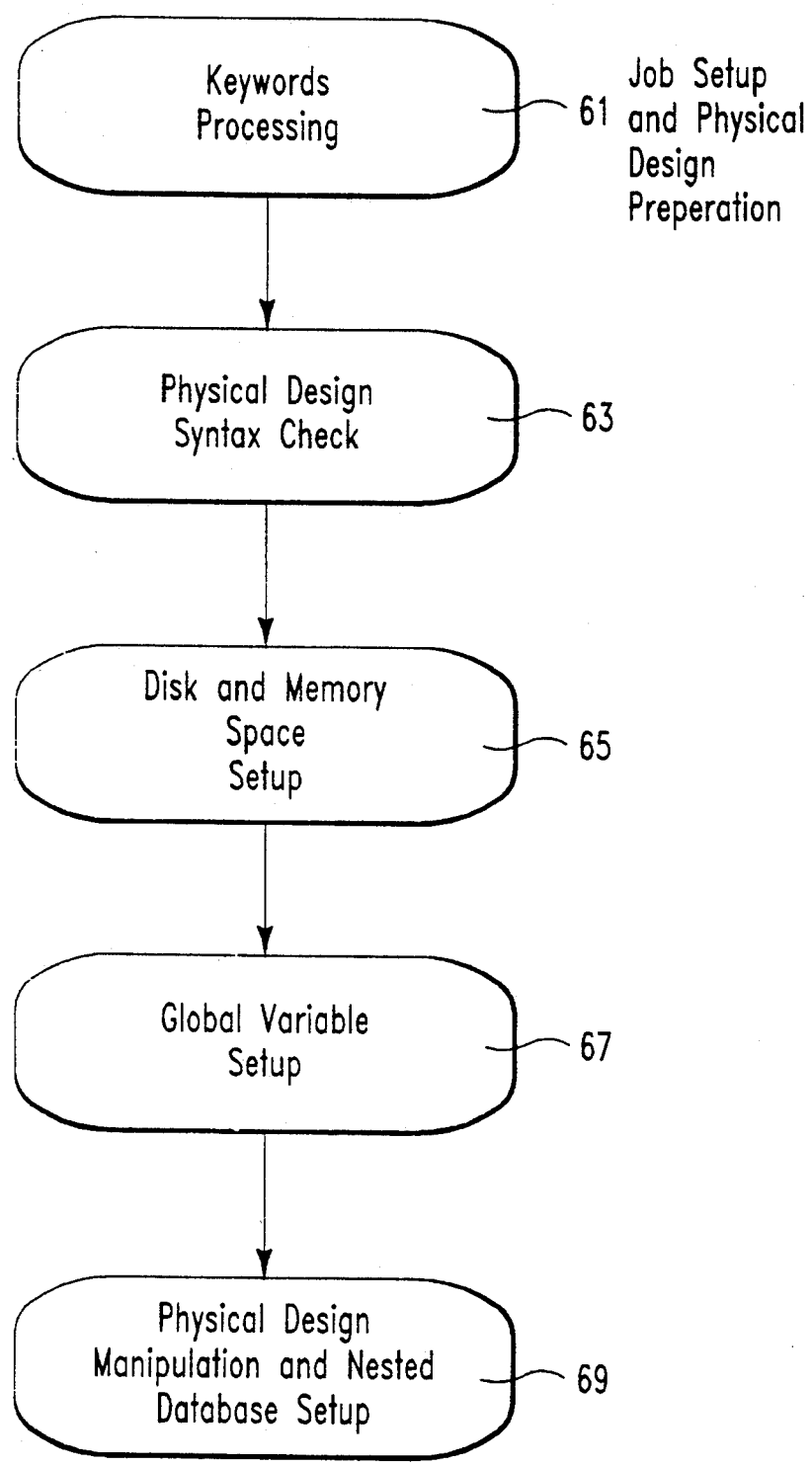

FIG. 2B is a flow diagram of the Job Setup & Physical Design Preparation step 60 of FIG. 2A. Table 2 is a pseudo code description of the Job Setup & Physical design Preparation step 60 corresponding to the flow diagram of FIG. 2B. In executing the Job Setup and Physical Design Setup step 60, first, keywords 32 are read and syntax checked in the Keywords Processing step 61. The physical design data may contain several buildlevels. Each buildlevel will have one or more levels called data levels. Next, in the Physical Design Syntax Check 63 step, the design is read, syntax checked for correctness and reorganized by buildlevel (based on keyword settings) and, design tables are built. Next, in the Disk and Memory Setup step 65, Direct Access

TABLE 2

| Job Setup & Physical Design Preparation |
| --- |
| • Process the keywords 61<br>  1 Read and process the keywords<br>  2 Cross check the keywords<br>  3 Store the keywords<br>• Syntax check the physical design 63<br>  1 Read in the physical design, syntax check it<br>  2 Organize the design by buildlevel (layer) and by datalevel with buildlevels<br>  3 Store the physical design on disk<br>• Set up the job memory usage 65<br>  1 Create the memory usage TABLE (VVTOC)<br>• Set up global information 67<br>  1 Allocate memory for variable storage<br>  2 Set global parametric information into each function's Functional Control Data Block (FCDB)<br>  3 Create all dataset (disk) and datalist (memory) names<br>• If there are more than one buildlevel 69<br>  1 Examine all the etch values of all active datalevels<br>  2 If no multiple datalevels occur, load the nested database (memory); etch the data while loading. |

Storage Device (DASD) space and Random Access Memory (RAM) space are allocated. When used hereinafter the term memory is intended to include both DASD and RAM unless provided otherwise. A Virtual Volume Table of Contents (VVTOC) provides a means of keeping track of memory usage. In the Global Variable Setup 67 step, processing variables are set with values that remain constant throughout the run. In the Physical Design Manipulation and Nested Database Setup step 69, if, for every datalevel, a datalevel parameter, called the etch value is common to all buildlevels, then the physical design is loaded into a nested (hierarchical) database.

Data levels contain shapes that are selectively incorporated into the final mask or wafer provided a set of predetermined conditions exist when that mask or wafer is created. For example, a buildlevel may have a negative datalevel and a positive datalevel; and, which datalevel is postprocessed into N/C data depends on whether the final mask or wafer shape is to be negative or positive. Each buildlevel corresponds to one of the multiple layers of the final semiconductor chip and must be postprocessed separately.

TABLE 3

| Level Setup & Nested Shapes Processing |
| --- |
| • Find and store the current buildlevel's information 71<br>• If the nested database is to be loaded by buildlevel, do so 72<br>• If proximity correction is requested, then 73<br>  1 Load the existing table corresponding to the proximity parameters<br>  OR<br>  2 Create a new table, storing it if requested<br>• Call the Nested Shapes Processing subexecutive 80<br>• Determine the parceling 75<br>• Store the local (buildlevel) variables 76 |

Figure 2C:
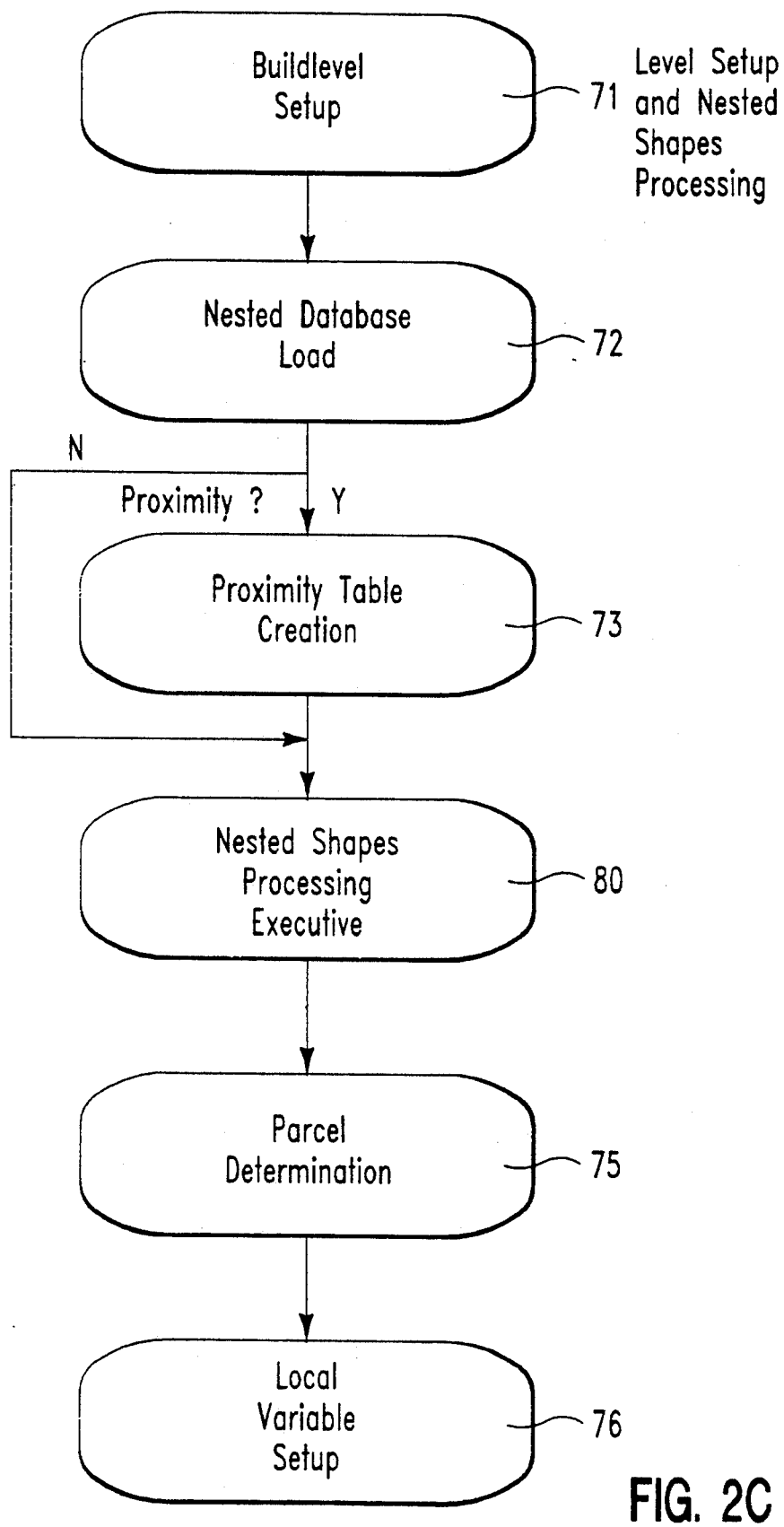
Figure 2D:
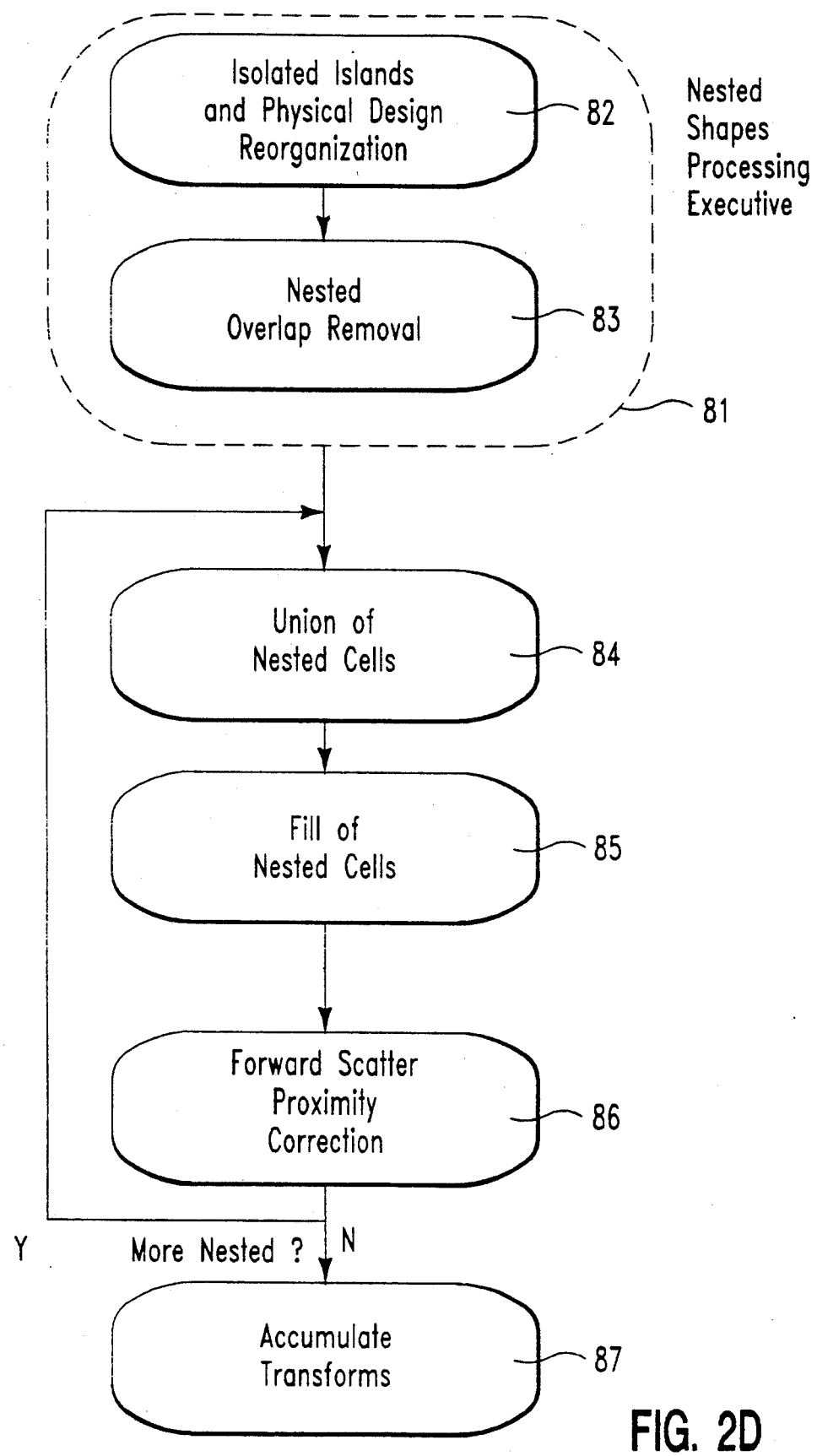

Next, in the Level Setup & Nested Shapes Processing step 70 of FIG. 2A, each buildlevel is prepared for conversion to NC data according to FIG. 2C. Table 3 is a pseudo code listing of the Level Setup & Nested Shapes Processing step 70 according to FIG. 2C. First, in the Buildlevel Setup step 71, all of the data pertinent to the current layer is collected. If, for example, the etch value for a data level is not the same on each buildlevel, then the datalevel is said to have multiple etch values. These multiple etch values are identified in this Buildlevel Setup step 71. All of the data identified in the Buildlevel Setup step 71 are loaded into the nested database 72. A frame is determined for each design cell when the nested database is loaded. For most design cells the frame is a Least Enclosing Window (LEW). However, convex cells require a more complicated frame reflecting that convexity. A Proximity Correction Table 73 is created for the current buildlevel, provided the buildlevel is to be proximity corrected. Next, in the Nested Shapes Processing step 80, as shown in FIG. 2D and described below, a group of design shapes is identified and labeled as "Nested Candidates." Any shapes not identified as a Macro or Nested Candidates are identified as Unnested Candidates. The design is divided into parcels 75: First, based on the number of Unnested Candidate's vertices; and then, any resulting parcels that have a vertex count which exceeds a maximum vertex count (including Macro and Nested Candidate frames' vertices) are further subparcelled. Finally, any variables that remain constant throughout the buildlevel are defined 76.

Parceling significantly reduces postprocessing time and CPU requirements over the prior art. Normally, CPU demands increase with the square of the number of shape edges (or vertices). Thus, a 64 Mbit Dynamic RAM (DRAM) mask will take over 4000 times the computer time a roughly equivalent 1 Mbit DRAM. Surprisingly, however, this increase can be made linear, i.e., proportional to N instead of $N^2$. It was discovered that by dividing a design into M individual parcels, each parcel having an equal number of vertices, then each parcel required $1/M^2$ the CPU time of the whole design. Thus, M parcels took $M/M^2$ or $1/M$ the CPU time required for the whole design. So, CPU time for a complex design which increased by $N^2$, instead would increase by $N^2/M$. Thus if $M=N$, the aggregate CPU time increases with N instead of $N^2$. It was further determined that the preferred or optimum number of vertices is approximately 250,000. Thus, by parceling each buildlevel into parcels, with each parcel having an optimum number of shapes determined by the preferred number of vertices, a design, which, by prior art methods, was impossible to postprocess, becomes possible. Therefor, an optimum number of shapes is the number of shapes having the preferred number of vertices, and so, varies for each parcel.

TABLE 4

Nested Shapes Processing Executive

- Call Nested Analysis 81
  1 Find "Isolated Islands" in the design 82
  2 Perform Physical Design Reorganization
  3 If needed, Call Nested Overlap Removal 83
  4 Store the Nested Candidates information
- Do for each Nested Cell
  - Retrieve the Nested Cell's shape and frame data
  - Union the Nested Cell 84
  - Fill the Nested Cell 85
  - Forward Scatter Proximity Correct 86 the Nested Cell
  - Store the Nested Cell's partially Proximity Corrected Fill data for subsequent use
- Accumulate Transforms 87
  1 Find the final placement transforms on all Macro and Nested Candidates When Nested Shapes Processing step 80 is done, the design is optimized to reduce CPU time and memory resource requirements. FIG. 2D is a flow diagram of the Nested Shapes Processing step 80. Table 4 is a pseudo code description of the Nested Shapes Processing step 80 according to FIG. 2D. The design is optimized by finding the most suitable Macros and by creating Nested Candidates that can be treated as macros through most of post processing. A Nested Candidate (cell, net, group of shapes) can be Unioned, Filled and partially Proximity Corrected once and, then, placed multiple times. Two identical design shapes that are filled identically and have identical proximity correction values for their fill rectangles are said to have a "common environment." If those same two shapes have identical fill rectangles but dissimilar proximity correction values, they are said to not have a common environment. Macros, by definition have a common environment. Nested Candidates are repetitious shapes or groups of shapes that do not have a common environment, because, by definition, some of their filled shapes do not have common proximity correction values.

Proximity correction values are calculated to correct for two types of electron scattering, forward scattering and backward scattering. Forward scattering is electron dispersion that occurs as electrons travel from the E-beam source to the photo-resist. It is analogous to light beam spread. Shapes immediately adjacent to the intended area receive increased exposure because of forward scattering. The farthest distance from the beam's focal point at which shapes are affected by forward scattering is the Forward Scatter Range.

Figure 3:
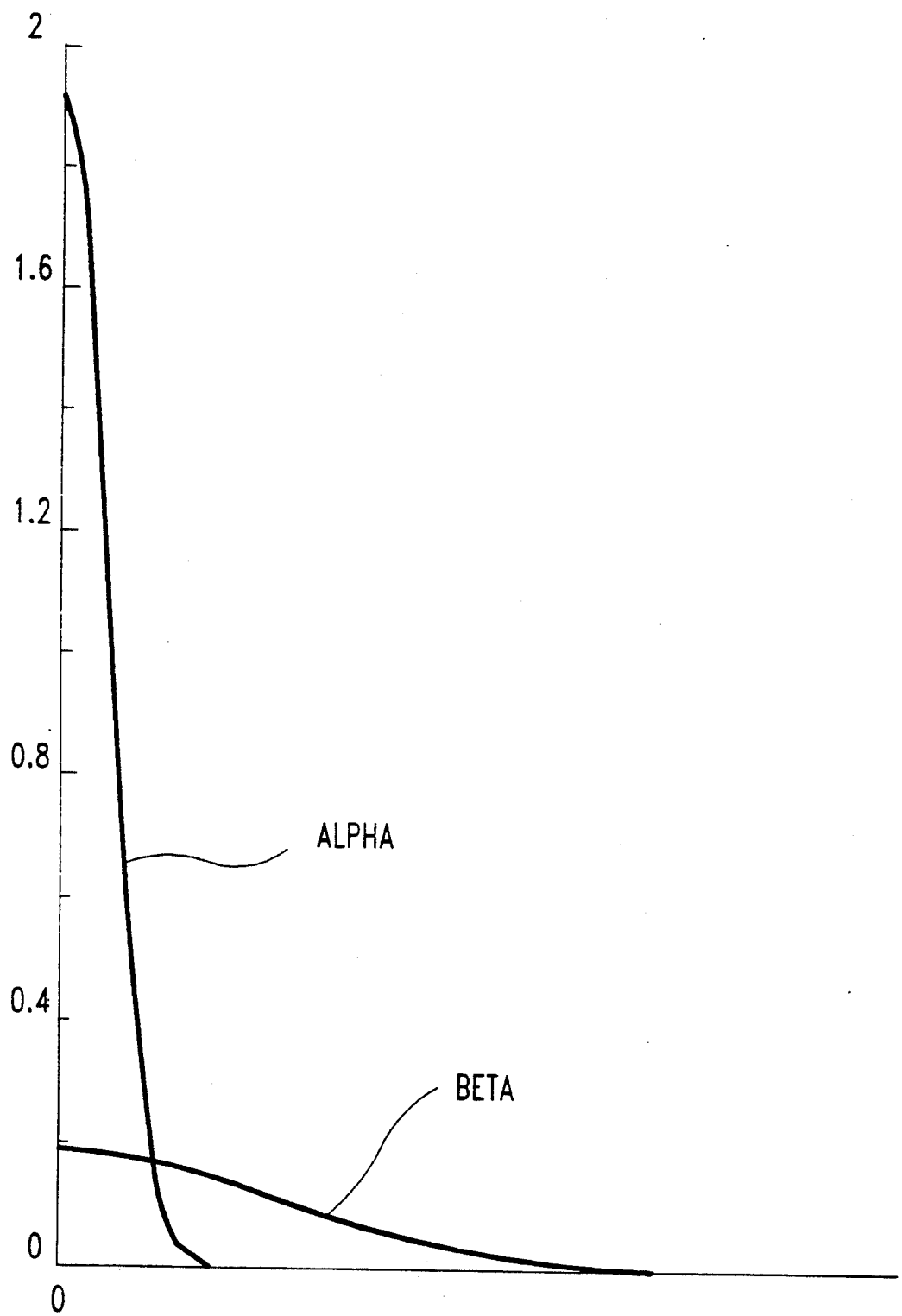
FIG. 3 shows an electron beam scattering distribution.

Backward Scattering is electron dispersion that occurs as some electrons which strike the photo-resist reflect back at an oblique angle to the beam. The farthest distance from the beam focal point at which shapes are affected by backward scattering is the Back Scatter or Backward Scattering Range. Both types of scattering have a Gaussian Normal distribution (bell shaped curve) with respect to the distance from the beam's focal point. See FIG. 3 for a diagrammatic representation of Forward and Backward Scattering effects. The population for backward scattering is a fraction of that for forward, because the number of electrons reflected back (backward) from the E-beam target is less than the electrons traveling (forward) to the target. The scattering range is taken to be 3 times the standard deviation, the $3\sigma$ distance, from the beam's focal point, i.e. 99% of the electrons strike within the scattering range.

For a given electron beam exposure level, the Back Scatter Range may be orders of magnitude larger than the Forward Scatter Range. Furthermore, the difference between the Back Scatter Range and Forward Scattering Range increases with the electron beam intensity. This difference increases because reflected electrons have more energy and are, therefore, reflected at more acute angles to the target and travel further through the photo-resist.

By definition, Nested Candidates have a common forward scattering environment, but do not have a common backward scattering environment. Furthermore, a nested candidate cell must not overlap or be overlapped by other placed cells.

So, in the Nested Shapes Processing step 80, first, the design data is analyzed to identify potential Nested Candidates 81. Each cell's frame is used to find cell overlaps that exist in the design 82. A convex cell might have shapes that overlap the cell's LEW, but do not overlap the cell. Thus, the above requirement of a more complex frame for convex cells. Cells (or groups of cells) that have no overlap with other groups are included as Nested Candidates, as they are Isolated (nonoverlapping) Islands (sets) of shapes. These Nested Candidates are moved to the nested datalevel and the nested database is reorganized for efficiency.

After isolating islands and reorganizing the design 82, an attempt is made to remove overlap 83 from any cells that have been determined to have cells or shapes overlapping them. If the overlap can be successfully removed 83 (that is, clipped so that the overlapping shapes or cells now butt rather than overlap), these additional cells will be Nested Candidates. Cells with overlaps that cannot be removed 83, or that are not repetitious enough to make nesting advantageous are identified as Unnested Candidates. Then, the Nested Candidates are Unioned 84, Filled 85, Forward Scattering Proximity Corrected 86 and stored 87 for the Parcel Processing step 100.

TABLE 5

Macro Cell Processing

- Retrieve the Macro shape and frame data 91
- Do for each Macro Cell
  - Union the Macro Cell 92
  - Fill the Macro Cell 93
  - If requested, Proximity Correct the Macro Cell 94
  - Organize (for Graying) and store the Macro Cell's proximity corrected fill rectangles 95
- Enddo
- Process the Macro Cells' frames 96

Figure 2E:
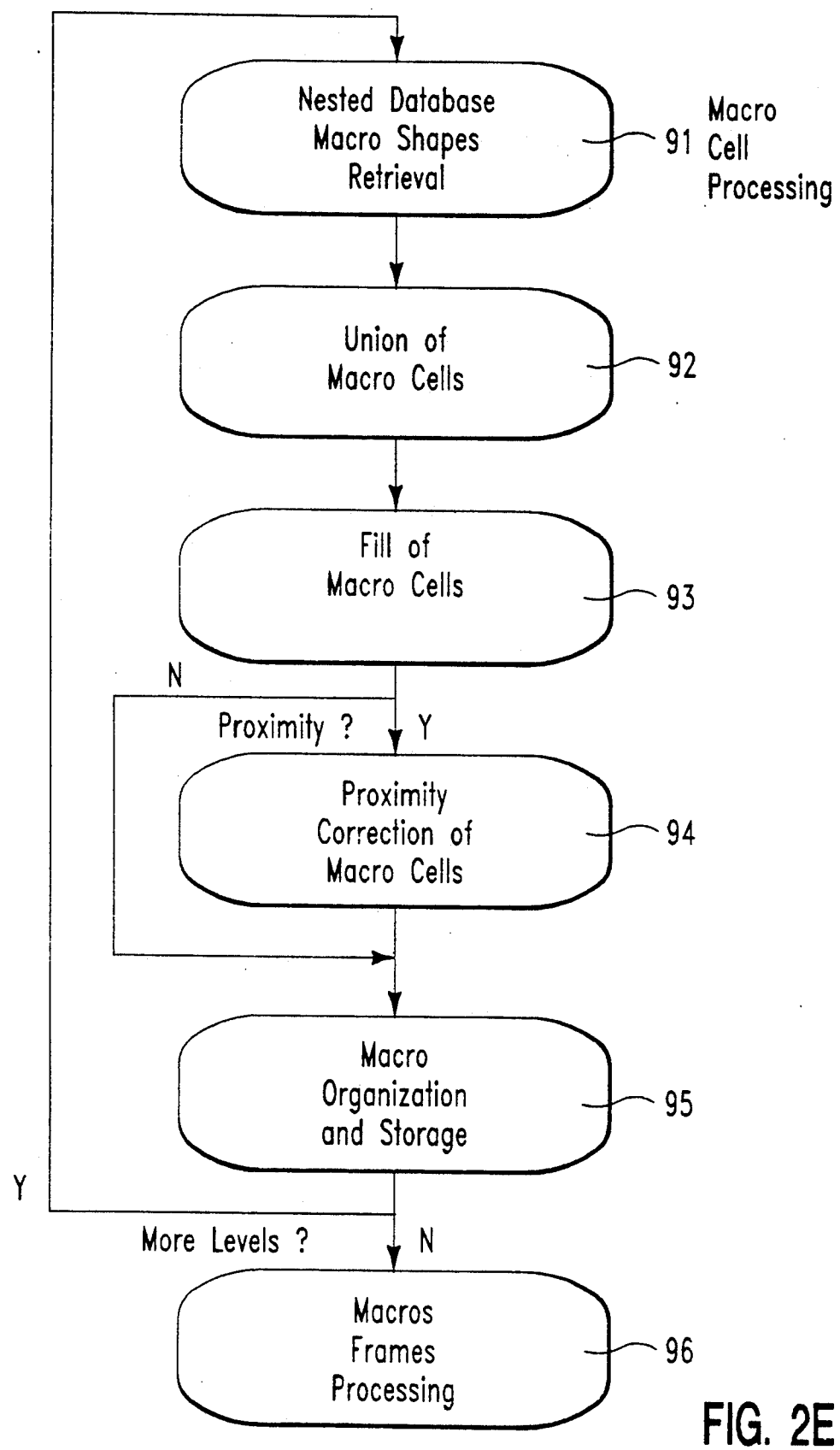

After the Level Setup and Nested Shapes Processing step 70, macros are processed 90 as in FIG. 2E, which is represented in pseudo code in Table 5. First, previously defined macros (defined either by the user or, alternately defined in the nested shapes processing step 80) are retrieved from the nested database 91. Next, each of the retrieved Macro Candidates (these remain nested throughout postprocessing) are Unioned 92, Filled 93, fully Proximity Corrected 94 and the results stored 95 for modification. Because they have a common environment, proximity correction for each of the Macro Candidate's fill rectangles is done for both forward and backward scattering. Therefore, once a Macro Candidate has been proximity corrected, nothing else needs to be done until the gray-splicing. Finally, after all of the Macro Candidates have been unioned 92, filled 93, proximity corrected 94 and stored 95, the macro boundary frames are defined 96. The macro's boundary frame, which is used to identify overlapping shapes, also provides a macro boundary for a negative fill level.

TABLE 6

Parcel Processing

Figure 2F:
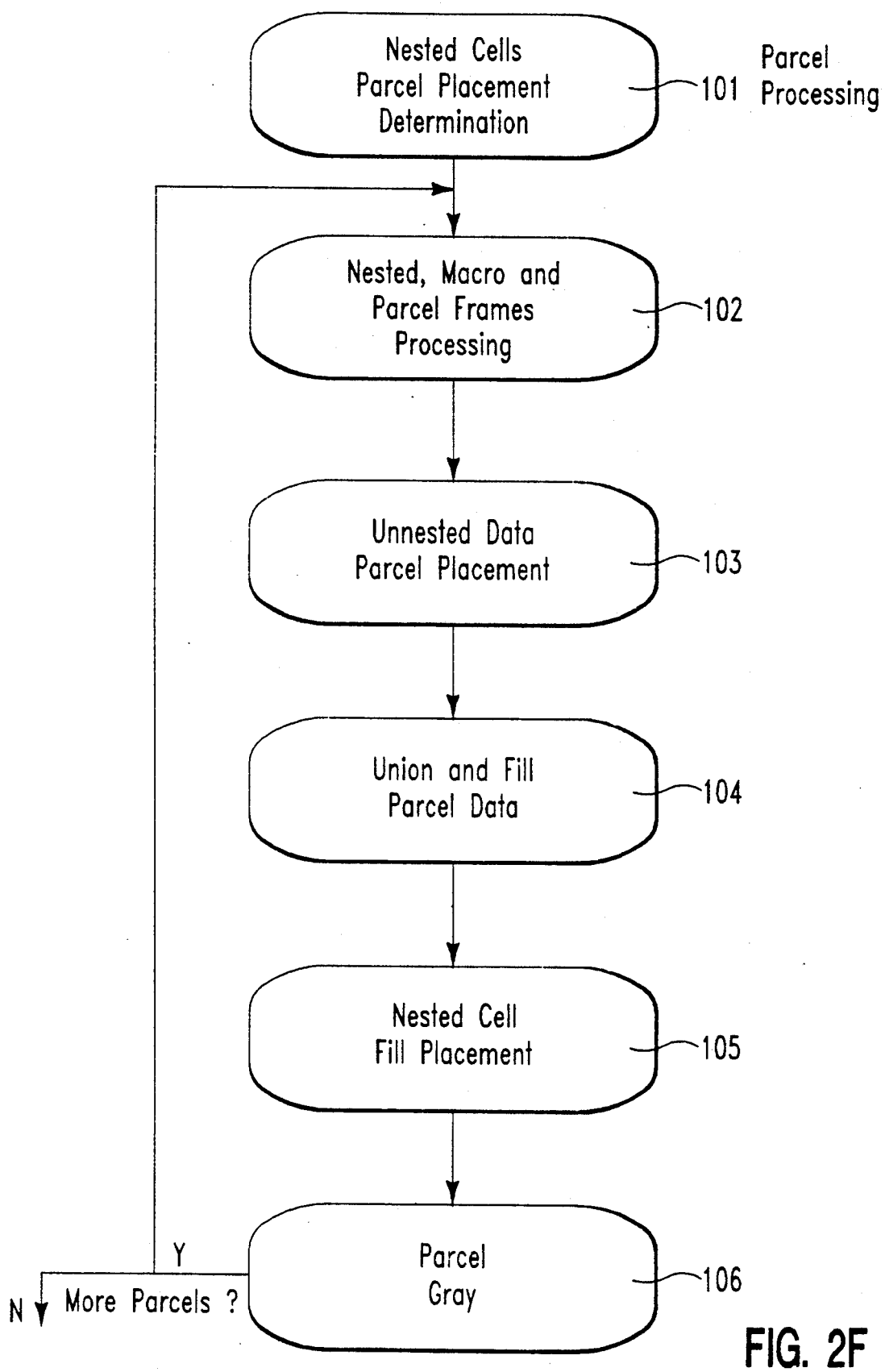

- Determine Nested Cells' parcel placement 101
    - Assign each accumulated transform to a parcel
- Do for each parcel
    - Retrieve the Nested, Macro and Parcel frames 102
        1 Union the frames to get to (possibly subset) range of the parcel containing Unnested Candidates
    - Retrieve the Unnested Cells in the parcel 103
    - Union and Fill the Unnested Cells 104
    - Merge the already filled Nested Cells in this parcel 105
    - Gray all the Nested and Unnested Data in the parcel 106
- Enddo Because of the advantage of dividing the design into parcels 75, Unnested Candidates are unioned and filled by parcel, according to FIG. 2F. Table 6 is a pseudo code listing representing of the parcel processing step 100, which corresponds to FIG. 2F. First, Nested Candidates' transforms are identified by the parcel or parcels in which the transform's shapes lie 101. Next, all Macro & Nested Candidate frames within a given parcel are retrieved and unioned 102. Then Unnested Candidates' edges are added to the parcel 103. The Unnested Candidates' edges are then Unioned and Filled 104 and the macro frames are used to remove non macro shape overlaps. After retrieving the filled and unioned Nested Candidate shapes for the parcel 105, using the transform assignment from 101, and unnesting those Nested Candidates, all shapes in the parcel are grayed 106. Gray-splicing unnested shapes is done as proved in Application Ser. No. 07/856,605 to Frei, assigned to the Assignee of the present invention and incorporated herein by reference.

TABLE 7

Proximity Correction

- Do for every Non-macro shape 112
    - Assign shape to a parcel
    - If within the Proximity range of another parcel then
        1 Copy the shape and mark as reference
        2 Assign a reference copy to all parcels which it is in range of
- Enddo
- Do for each parcel
    - Access the parcel data 114
    - Access the parcel reference data 116
    - Forward Proximity Correct the Unnested Candidates 118
    - Backward Proximity Correct the Unnested and Nested Candidates
    - Store the parcel resident shapes TABLE 7-continued Proximity Correction

- Enddo

Figure 2G:
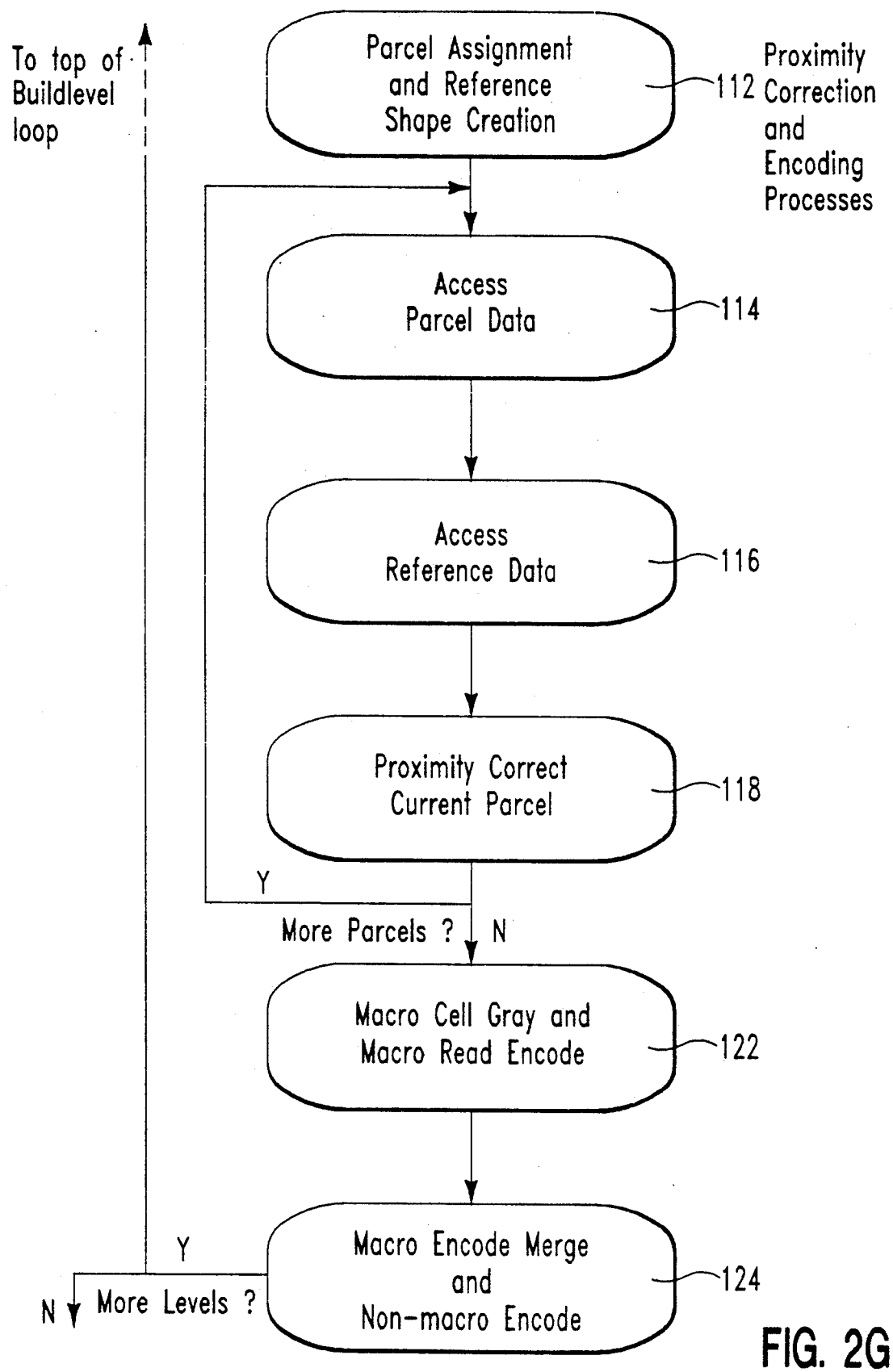

Next 110, the Unnest Candidates must be proximity corrected according to FIG. 2G, and the result encoded as NC data. Table 7 is a pseudo code listing of the Proximity Correction step 110. In the preferred embodiment of the present invention, proximity correction values are calculated according to U.S. Pat. No. 5,051,598 to Ashton et al., assigned to the assignee of the present invention and incorporated by reference. Although, Proximity Correction 110 is done by parcel, the grayed shapes resulting from the parcel processing step 100 may have portions assigned to different parcels. So, first, each non-macro shape is assigned to a parcel. Because a shape's back or forward scatter range may encompass shapes in adjacent parcels, shapes within the backscatter range of the parcel boundary are also copied into adjacent parcels as a reference shape 112. Therefore, grayed shapes will be copied into adjacent parcels as reference shapes 112. Next, in each parcel, shapes within the parcel 114, as well as the shapes within the backscatter range 116 are identified. After identifying the shapes within a parcel required for proximity correction 114 & 116, the proximity correction values are calculated for shapes within the parcel 118. Unnested Candidates are proximity corrected both for Forward and Backward Scattering. Nested Candidates are proximity corrected only for Backward Scattering.

TABLE 8

Macro and Non-macro Encoding

- Process the Fillshapes and Macro shapes into N/C data 120
- Gray the Macros, creating macro read commands 122
- Encode the Non-macro data; merge the Macro data 124

Finally, the shapes are encoded 120 as NC Data as provided by the pseudo code listing of Table 8. First, the macros are Gray-spliced as described in U.S. patent application Ser. No. 07/784,834 to Dick, assigned to the Assignee of the present invention and incorporated herein by reference. Then macro read commands are merged with the proximity corrected unnested data and encoded 124.

Figure 4A:
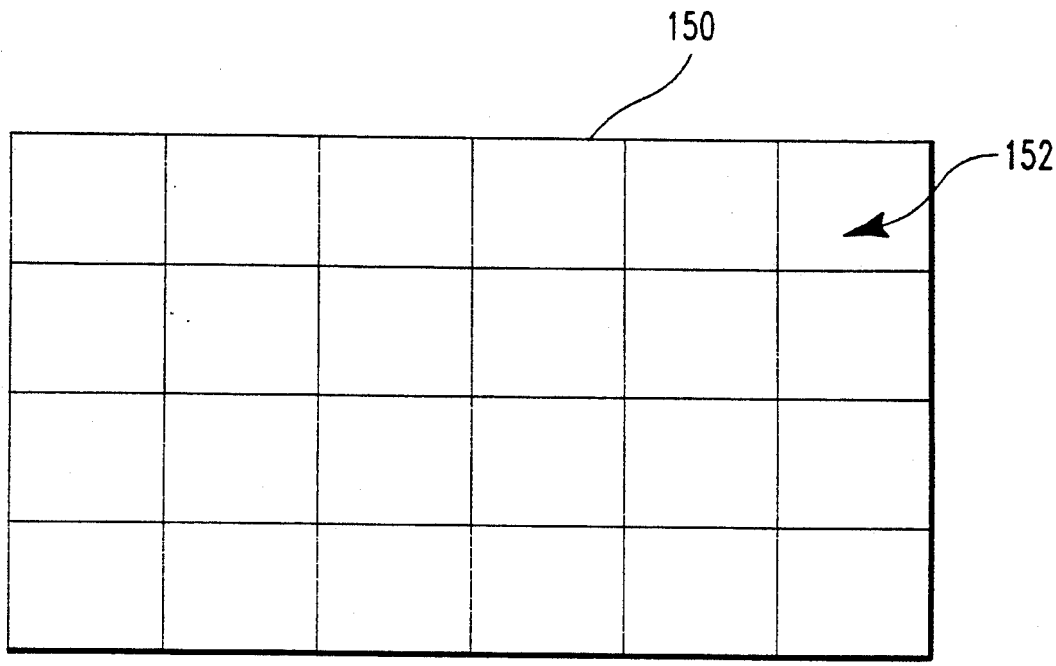
FIG. 4A-B is an example of a parceled design.
Figure 4B:
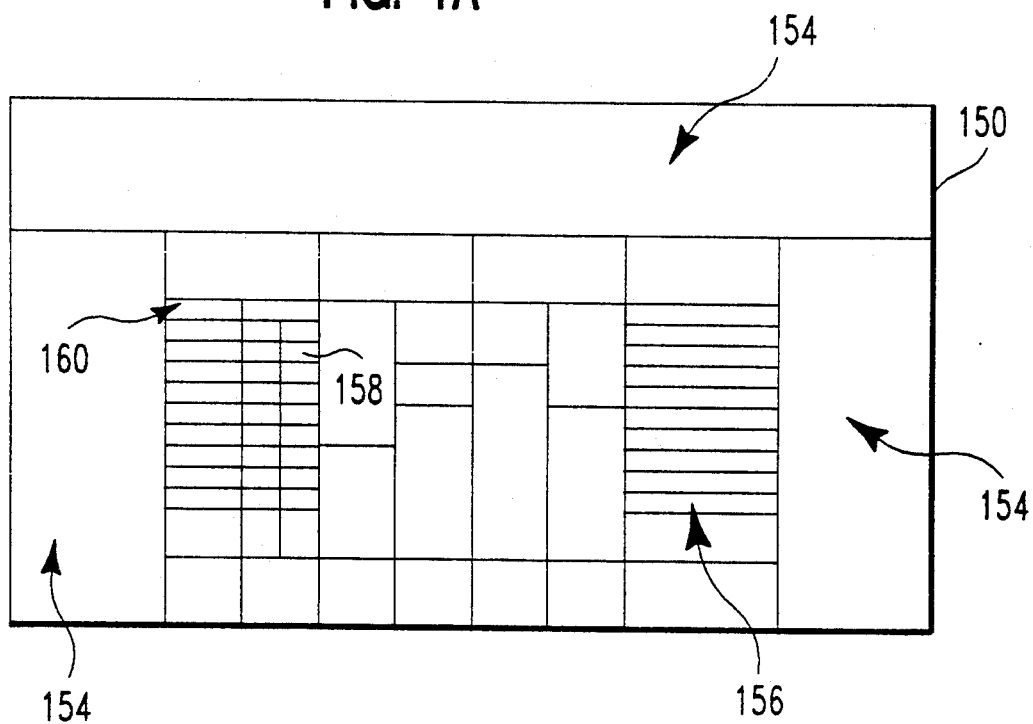

FIGS. 4A-B provide an example of a DRAM chip 150, parceled and postprocessed according to the preferred embodiment of the present invention. After the first parceling pass of the parcel determination step 75, the chip is parceled uniformly as in FIG. 4A. Each parcel is represented by a rectangle 152. After completion of the parcel determination step 75, the parcels of chip 150 are no longer a uniform size, as represented in FIG. 4B. Instead, larger parcels 154 correspond to a design area with fewer shapes. Smaller parcels 156, 158 and 160 are denser portions of the design, such as arrays. The remaining, unlabeled parcels are array support circuitry and are moderately dense.

Figure 5A:
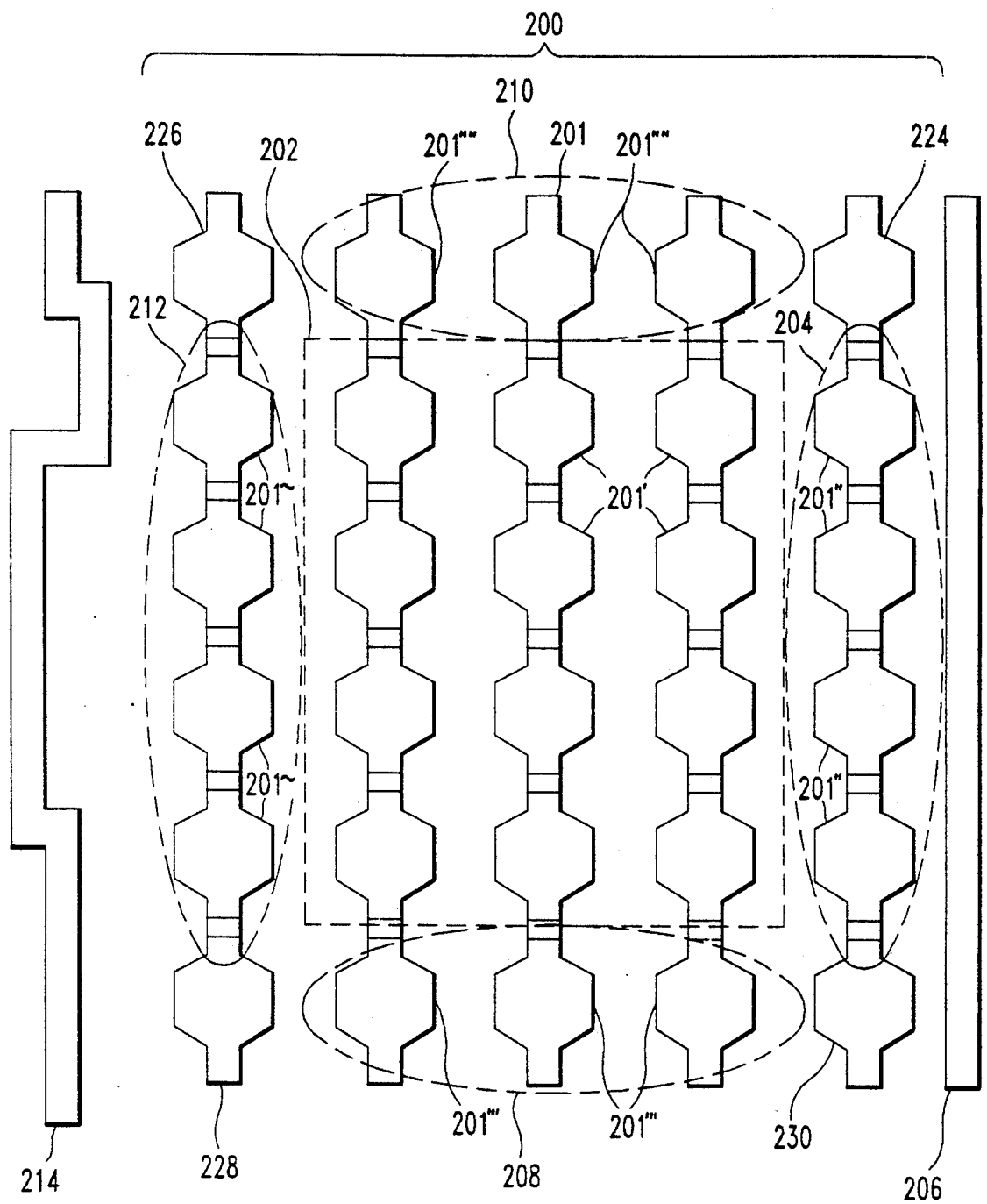
FIG. 5A-C is an example of cell transforms in a parcel.
Figure 5B:
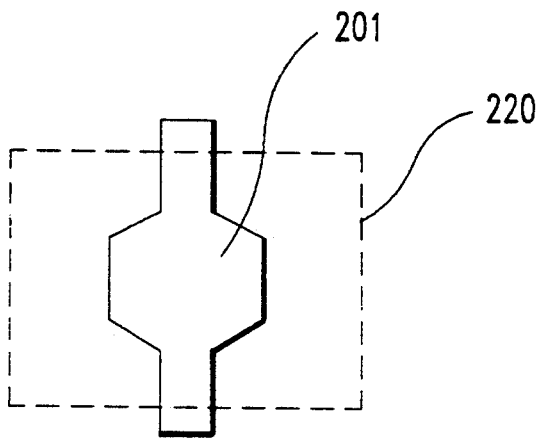
Figure 5C:
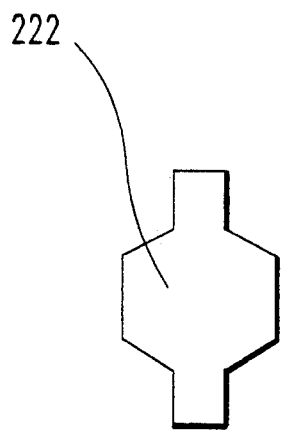

Continuing the example of FIGS. 4A-B in FIGS. 5A-C, parcel 160 is representative of the array 200 in FIG. 5A. The grouping of array cells 201 results from both scattering affects on the array 200 and the instance counts of array cells 201 with a common environment. So, for this example, the single cell shape 201 of FIG.

5B is repeated 12 times and grouped in the central area 202 of the array. Because each cell transform 201' in the central area 202 has the same proximity environment and is surrounded by identical transforms of itself, cell transform 201' is a Macro Candidate. The cell transforms 201'' in column cells 204 also have a common environment and, therefore, 201'' is a Macro Candidate. Cell transforms 201'' in column portion 204 are Macro Candidates because each cell transform 201'' has a copy of itself to its left and an identical piece of the line (wire) 206 to its right. Area 202 is called a 2-dimensional (2D) Macro Candidate. Column portion 204 is called a 1-dimensional (1D) Macro Candidate. Optionally, cell 201''' in row portion 208 and 201'''' in row portion 210 could also be 1D Macro Candidates. 201''' has identical 201 transforms above, left and right and empty space below. 201'''' has identical 201 transforms below, left and right and empty space above. Therefore, cell 201''' and cell 201'''' would become Macro Candidates if they are sufficiently repetitive, i.e., their instance counts exceed a predetermined minimum. FIG. 5B, represents the cell 201 and its frame 220. As described above, the frame 220 is used for overlap removal and for negative mask fill.

The cells 201~ in column portion 212 have a common environment on their right side, but a differing environment, line 214 on their left side. Because they can be Unioned, Filled, and Forward Scatter Proximity Corrected nested, but must be Back Scatter Proximity Corrected and Grayed individually, the cells 201~ in 212 are Nested Candidates. Once they are identified as Nested Candidates, the cells 201~ of 212 are cropped at their frame edges to eliminate overlap, resulting in the Nested Candidate shape 222 in FIG. 5C.

Since any shapes not labeled Nested Candidates or Macro Candidates are Unnested Candidates, lines 206 and 214 and cells 224, 226, 228 and 230 are Unnested Candidates. Each environment of each Unnested Candidate is unique and, therefore, each Unnested Candidate is unioned, filled, proximity corrected (both for forward and backward scattering) and grayed, individually (unnested).

EXAMPLES

Table 9 lists relevant cell and shape data for a single design layer of the 1 Mbit Dynamic RAM (DRAM) similar to the example of FIGS. 4 and 5.

TABLE 9

| CELL NAME | No. Occurrences | No. Shapes/Cell |
|---|---|---|
| CELLMACD | 489,953 | 341 |
| ARRAYCTR | 213 | 3,200 |
| ARAYVPLY | 9 | 3,582 |

As the E-beam intensity increases, the number of Macro Candidates dramatically decreases. Table 10 shows the effects of increasing E-beam intensity on data compaction. Increasing E-beam intensity increases the number of additional unnested shapes that result because of increased backward scattering at higher energy.

TABLE 10

| ENERGY | 25 KV | 50 KV | 75 KV | 100 KV |
|---|---|---|---|---|
| CELLMACD | 486,048 | 454,720 | 420,640 | 380,256 |
| ARRAYCTR | 213 | 0 | 0 | 0 |
| ARAYVPLY | 9 | 0 | 0 | 0 |
| UNNESTED SHAPES | 1.3 M | 13 M | 24 M | 38 M |

The Proximity correction method of the preferred embodiment of the present invention uses a look up table wherein each shape within the forward scatter range requires 16 table look-ups. If the average number of shapes in the forward scattering range is 4 then the number of look-ups required for prior art forward scatter proximity correction for each cell is determined by:

FORWARD_SCATTER_LOOKUPS =

(# of repetitious cells) * (# of shapes in the cells) * 4 * 16.

Table 11 shows the effect of E-beam intensity on the number of each cell transform that does not share a common environment with other cell transforms. Table 11 also provides a comparison of the number of FORWARD_SCATTER_LOOKUPS required for both an unnested method and the method of the preferred embodiment of the present invention.

TABLE 11

| ENERGY | 25 KV | 50 KV | 75 KV | 100 KV |
|---|---|---|---|---|
| CELLMACD | 3,905 | 35,233 | 69,314 | 109,697 |
| ARRAYCTR | 0 | 213 | 213 | 213 |
| ARAYVPLY | 0 | 9 | 9 | 9 |
| LOOKUPS REQ'D | 8.5E + 7 | 8.15E + 8 | 1.56E + 9 | 2.44E + 9 |
| UNNESTED | | | | |
| LOOKUPS REQ'D NESTED | 21,824 | 455,872 | 455,872 | 455,872 |

The resulting data reduction and computer resource saving in the preferred embodiment method is evident by comparing the number of Unnested shapes with the number of Nested shapes in Tables 10 and 11.

While what is considered the preferred embodiments of the invention are herein described, variations of and modifications thereof will occur to those skilled in the art. Therefore, it is intended that the appended claims shall be construed to include the preferred embodiments and all such variations and modifications in form and detail that fall within the spirit and scope of the invention.

We claim:

1. A system for post processing a design containing a plurality of design shapes, said post processed design shapes being converted into control for controlling a particle beam tool said system comprising:

parcelling means for dividing said design into one or more parcels, each said parcel having a plurality of said design shapes;

grouping means for grouping said plurality of design shapes into a plurality of groups;

filling means for filling said design shapes with one or more fill shapes having the same said fill shapes having a common basic shape;

correcting means for selectively applying an exposure level adjustment to said fill shapes; and cutting means for cutting at least one said fill shape into at least two smaller fill shapes.

2. The system of claim 1 further comprising storage means for storing said filled shapes.

3. The system of claim 1 further comprising writing means for exposing a radiation sensitive layer.

4. The system of claim 1 further comprising unioning means for combining a plurality of said design shapes into a single shape.

5. The system of claim 1 wherein said plurality of groups comprises a Macro Candidate group and a Nested Candidate group.

6. The system of claim 5 wherein each Macro Candidate in said Macro Candidate group is a cell comprised of one or more of said design shapes, said each Macro Candidate has a plurality of transforms with a common environment.

7. The system of claim 6 wherein each Nested Candidate in said Nested Candidate group is a cell comprised of one or more of said design shapes, said each Nested Candidate has a plurality of cell transforms, at least one said cell transform with an environment different from at least one other said cell transform.

8. The system of claim 1 wherein the grouping means further comprises means for identifying a common environment for at least two cell transforms.

9. The system of claim 8 wherein the grouping means further comprises means for determining a difference in an environment for at least two cell transforms.

10. The system of claim 1 wherein the correcting means further comprises means for determining an exposure level adjustment for a backward scattering characteristic of said particle beam tool.

11. The system of claim 10 wherein the correcting means further comprises means for determining an exposure level adjustment for a forward scattering characteristic of said particle beam tool.

12. The system of claim 1 wherein the grouping means includes means for detecting an intrusion of a shape into a cell frame.

13. A method of post processing a design to convert said design to controls for exposing a radiation sensitive layer, said design comprised of a plurality of design shapes on a buildlevel, said method comprising:

a) Defining a plurality of parcels on one said buildlevel, each said parcel containing an optimum number of said design shapes;

b) Post Processing all of said design shapes in one of said parcels into particle beam control data; and c) Repeating step b) on each of said parcels until all of said plurality of design shapes are post processed.

14. The method of exposing a radiation sensitive layer to a plurality of design shapes of claim 13 wherein said optimum number of design shapes is determined by an optimum vertex number.

15. The method of exposing a radiation sensitive layer to a plurality of design shapes of claim 13 wherein at least one of said parcels on said build layer has less than an optimum number of shapes.

16. The method for exposing a radiation sensitive layer to a plurality of design shapes of claim 13 wherein the converting step b) compromises the steps of:

i) Grouping said optimum number of design shapes into a plurality of groups, said plurality of groups comprising a Macro Candidate group, a Nested Candidate group, and an Unnested Candidate group;

ii) Postprocessing the Macro Candidate group;

iii) Initial postprocessing the Nested Candidate group;

iv) Combining said Nested Candidate Group and said Unnested Candidate group into a single group of unnested shapes; and v) Postprocessing said single unnested shape group, wherein initial postprocessing is done only on the shapes from said Unnested Candidate Group.

17. The method of claim 16 wherein the Macro Candidate Post Processing step ii) comprises the steps of:

A) Filling each said Macro Candidate by Reconstructing each said Macro Candidate Shape from a least one fill shape;

B) Proximity correcting every said fill shape; and

C) Gray-splicing said Macro Candidate.

18. The method of claim 17 wherein the filling step A) of the Macro Candidate Postprocessing step ii) further comprises Unioning at least one said Macro Candidate shape before filling each said Macro Candidate shape.

19. The method of claim 18 wherein the Macro Candidate Postprocessing step ii) further comprises:

D) storing each said filled and proximity corrected Macro Candidate in a Macro buffer.

20. The Method of claim 19 wherein the stored Macro Candidate is stored as Numerical Control data.

21. The Method of claims 16 wherein the Nested Candidate initial Postprocessing step iii) comprises filling each of said Nested Candidates by reconstructing each said Nested Candidate shape from at least one fill shape.

22. The method of claim 21 wherein the Nested Candidate initial Postprocessing step iii) further comprises Unioning at least one said Nested Candidate shape before filling each said Nested Candidate Shape.

23. The Method of claim 21 wherein the Nested Candidate initial Postprocessing step iii) further comprises determining a forward scattering proximity correction value for each said fill shape.

24. The method of claim 21 wherein the single unnested shape group post processing step v) comprises the steps of:

A) Filling every shape from said Unnested Group by reconstructing each said former Unnested Candidate shape from at least one fill shape;

B) Determining a backward scattering Proximity Correction value for each said fill shape; and C) Determining a forward scattering Proximity Correction value for each said Unnested Candidate fill shape.

25. The method of claim 24 wherein the single unnested shape group post processing step v) further comprises the step of:

D) storing each said proximity corrected fill shape in a pattern buffer.

26. The method of claim 22 wherein the stored fill shapes are stored as Numerical control data.

27. The method of claim 16 wherein the Post Processing step b) further comprises the step of:
   vi) Exposing said radiation sensitive layer according to said post processed shapes.

28. A method of post processing a design to covert said design to control for exposing a radiation sensitive layer to a plurality of design shapes comprising the steps of:
   a) dividing said design into one or more parcels and grouping said design shapes into a plurality of groups, said plurality groups comprising a Macro Candidate group, a Nested Candidate group, and an Unnested Candidate Group;
   b) post processing the Macro Candidate group;
   c) initial post processing the Nested Candidate group;
   d) combining said nested Candidate Group and said Unnested Candidate Group into a single group of unnested shapes; and
   e) post processing said single unnested shape group, wherein initial post processing is done only on the shapes from said Unnested Candidate Group.

29. The method of claim 28 wherein the Macro Candidate Post Processing step b) comprises the steps of:
   i) Filling each said Macro Candidate by Reconstructing each said Macro Candidate Shape from at
   ii) Proximity correcting every said fill rectangle.

30. The method of claim 29 wherein the filling step i) of the Macro Candidate Processing step b) further comprises Unioning at least one said Macro Candidate shape before filling each said Macro Candidate shape.

31. The method of claim 29 wherein the Macro Candidate Post Processing step b) further comprises:
   iii) storing each said filled and proximity corrected Macro Candidate in a Macro buffer.

32. The method of claim 31 wherein the stored Macro Candidate is stored as Numerical Control data.

33. The method of claim 28 wherein the Nested Candidate initial Post Processing step c) comprises filling each of said Nested Candidates by reconstructing each said Nested Candidate shape from at least one fill shape.

34. The method of claim 33 wherein the Nested Candidate initial processing step c) further comprises Unioning at least one said Nested Candidate shape before filling each said Nested Candidate Shape.

35. The Method of claim 33 wherein the Nested Candidate initial Post Processing step c) further comprises determining a forward scattering proximity correction value for each said fill shape.

36. The Method of claim 33 wherein the single unnested shape group post processing step e) comprises the steps of:
   i) Filling every shape from said Unnested Group by reconstructing each said former Unnested Candidate Shape from at least one fill shape;
   ii) Determining a backward scattering proximity correction value for each said fill shape; and
   iii) Determining a forward scattering proximity correction value for each former said Unnested Candidate fill shape.

37. The Method of claim 36 wherein the single unnested shape group post processing step e) further comprises the step of:
   iv) storing each said proximity corrected fill shape in a pattern buffer.

38. The method of claim 37 wherein the stored fill shapes are stored as numerical control data.

39. The method of claim 28 further comprising the step of:
   f) Exposing said radiation sensitive layer according to said post processed shapes.

* * * * *

UNITED STATES PATENT AND TRADEMARK OFFICE
CERTIFICATE OF CORRECTION

PATENT NO. :  5,294,800
DATED      :  March 15, 1994
INVENTOR(S) : Virginia M. Chung, Gregory J. Dick, Abigail S. Ganong and Edward J. Stashluk, Jr.

It is certified that error appears in the above-identified patent and that said Letters Patent is hereby corrected as shown below:

Col. 17, Claim 29, line 27, after "at"

insert --least one fill shape; and--.

Signed and Sealed this

Fourth Day of April, 1995

Attest:

BRUCE LEHMAN

Attesting Officer     Commissioner of Patents and Trademarks